United States Patent
Komiyama et al.

(10) Patent No.: US 6,490,303 B1
(45) Date of Patent: Dec. 3, 2002

(54) LASER DIODE MODULE

(75) Inventors: Manabu Komiyama, Kawasaki (JP); Shunichi Sato, Kawasaki (JP); Noboru Sonetsuji, Kawasaki (JP); Tetsuo Ishizaka, Kawasaki (JP); Saeko Yokoi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/733,628

(22) Filed: Oct. 17, 1996

Related U.S. Application Data (62) Division of application No. 08/506,866, filed on Jul. 25, 1995, now Pat. No. 5,703,893.

(30) Foreign Application Priority Data

Jan. 13, 1995 (JP) .............................. 7-004512

(51) Int. Cl.$^7$ ................................................ G02B 6/00
(52) U.S. Cl. ........................................ 372/43; 359/819
(58) Field of Search ................................ 359/819, 811; 372/34, 36, 101, 108, 109

(56) References Cited

U.S. PATENT DOCUMENTS

| | | | |
|---|---|---|---|
| 4,762,395 A | * | 8/1988 | Gordon et al. .............. 359/819 |
| 4,803,689 A | * | 2/1989 | Shibanuma ................... 372/36 |
| 5,068,865 A | * | 11/1991 | Ohshima et al. .............. 372/36 |

FOREIGN PATENT DOCUMENTS

| | | | | |
|---|---|---|---|---|
| JP | 58-21890 | * | 2/1983 | ................. 372/109 |
| JP | 7-140361 A | * | 6/1995 | ............. H01S/3/18 |

* cited by examiner

*Primary Examiner*—Quyen Leung
(74) *Attorney, Agent, or Firm*—Katten, Muchin, Zavis, Rosenman

(57) ABSTRACT

Disclosed herein is a laser diode module having a thermoelectric cooling element, a laser diode, and a thermistor in a housing. The thermoelectric cooling element has a first surface and a second surface between which heat exchange is performed. The first surface is in close contact with an inner surface of the housing. A base is provided on the second surface in close contact therewith. A laser carrier and a thermistor carrier are provided on the base in close contact therewith. The laser diode and the thermistor are provided on the laser carrier and the thermistor carrier in close contact therewith, respectively. A portion of the base in the vicinity of the laser carrier is thermally connected to the housing by a metal plate, for example, thereby allowing high-precision temperature control of the laser diode.

3 Claims, 9 Drawing Sheets

LASER DIODE MODULE

This is division, of application Ser. No. 08/506,866, now U.S. Pat. No. 5,703,893 filed Jul. 25, 1995.

BACKGROUND OF THE INVENTION

1. Field of the Invention

The present invention relates to a laser diode module applicable to an optical fiber communication system.

2. Description of the Related Art

In a general optical communication system to which intensity modulation/direct detection (IM/DD) is applied, the light output power of a laser diode (LD) changes with an injection current. On the basis of this characteristic modulation current pulses are applied to the LD current-biased in the vicinity of an oscillation threshold to obtain light whose intensity is modulated. The I–L characteristic of the LD (the characteristic representing the relation between the injection current and the light output power of the LD) is dependent upon temperature and changes with a temperature change. It is therefore desirable to control the temperature of the LD to a constant value in order to obtain a constant operation condition irrespective of an ambient temperature.

Conventionally known is a laser diode module having a housing, a thermoelectric cooling element provided in the housing, a base provided on the thermoelectric cooling element, and an LD mounted through a laser carrier on the base. Further, thermistor is usually mounted by a thermistor carrier on the base,'so as to detect a temperature in the vicinity of the LD in the module. The thermistor is connected to a terminal for external connection of the module by a bonding wire formed of gold, for example.

As the gold bonding wire has a good thermal conductivity, a temperature difference between the inside and the outside of the module causes heat flow from the outside through the terminal and the bonding wire to the thermistor, or heat flow from the thermistor through the bonding wire and the terminal Lo the outside, so that high-precision temperature control cannot be performed. For example, when the temperature outside the module becomes relatively high, heat flows from the outside through the terminal and the bonding wire to the thermistor, so that the temperature of the thermistor becomes higher than that of the LD. Conversely, when the temperature outside the module becomes relatively low, heat flows from the thermistor through the bonding wire and the terminal to the outside, so that the temperature of the thermistor becomes lower than that of the LD. The I–L characteristic changes with such a temperature difference between the thermistor and the LD, causing a change in oscillation threshold $I_{th}$ of the LD to an unignorable degree (e.g., 2 to 3 mA) to result in a deterioration in signal characteristics.

SUMMARY OF THE INVENTION

It is therefore an object of the present invention to provide a laser diode module which can perform high-precision temperature control of the LD.

In accordance with the present invention, there is provided a laser diode module comprising a housing; a thermoelectric cooling element having a first surface and a second surface, the first surface being in close contact with an inner surface of the housing, for performing heat exchange between the first surface and the second surface according to a control current supplied; a base provided on the second surface in close contact therewith; a laser carrier and a thermistor carrier both provided on the base in close contact therewith; a laser diode and a thermistor provided on the laser carrier and the thermistor carrier in close contact therewith, respectively; and means for thermally connecting a portion of the base in the vicinity of the laser carrier to the housing.

In the present invention, the provision of the means for thermally connecting a portion of the base in the vicinity of the laser carrier to the housing facilitates the conformity of the temperatures of the thermistor and the laser diode, thereby allowing high-precision temperature control of the laser diode.

The above and other objects, features and advantages of the present invention and the manner of realizing them will become more apparent, and the invention itself will West be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described in detail with reference to the accompanying drawings.

Figure 1:
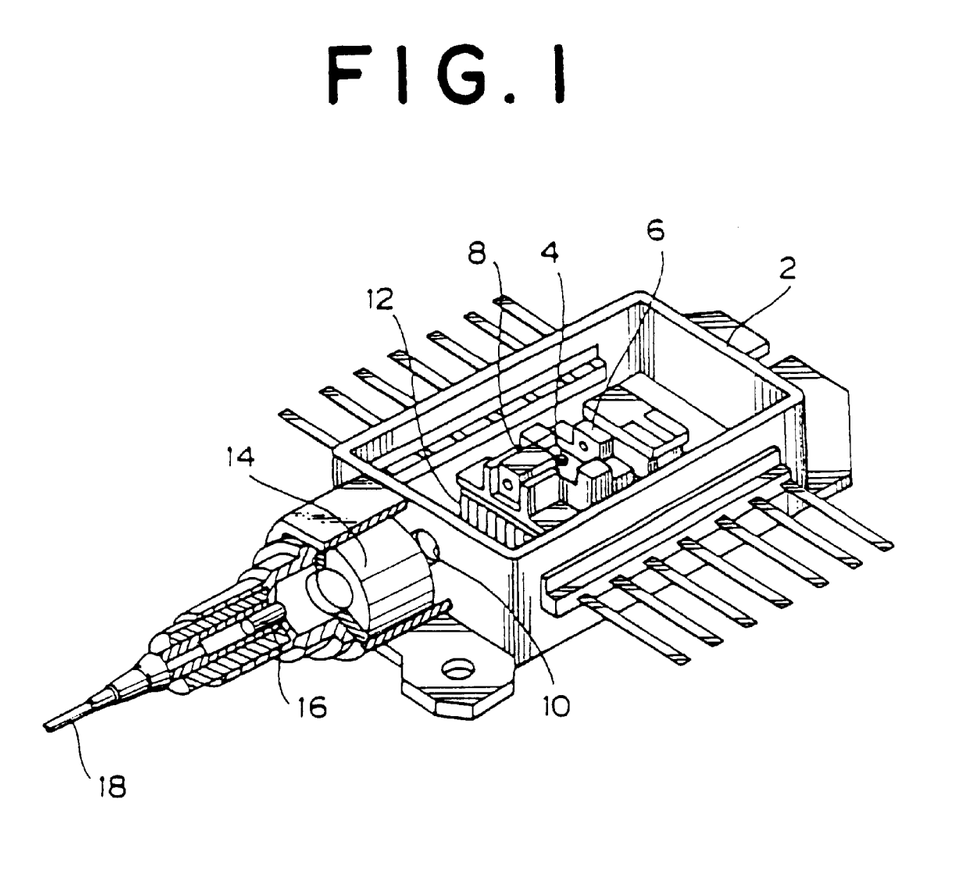
FIG. 1 is a cutaway perspective view of a laser diode module.

FIG. 1 is a cutaway perspective view of a laser diode module to which the present invention is applicable. A laser diode 4 provided in a housing 2 outputs forward light and backward light. The backward light is detected by a photodiode 6, and an output from the photodiode 6 is subjected to APC (automatic power control). The forward light from the laser diode 4 is collimated by a first lens assembly 8 and then output from a window 10. A thermoelectric cooling element (e.g., Peltier element) 12 for performing temperature control of the laser diode 4 is also provided in the housing 2. The light output from the window 10 is passed through an optical isolator 14, condensed by a second lens 16, and coupled to an excitation end of an optical fiber 18.

Figure 2:
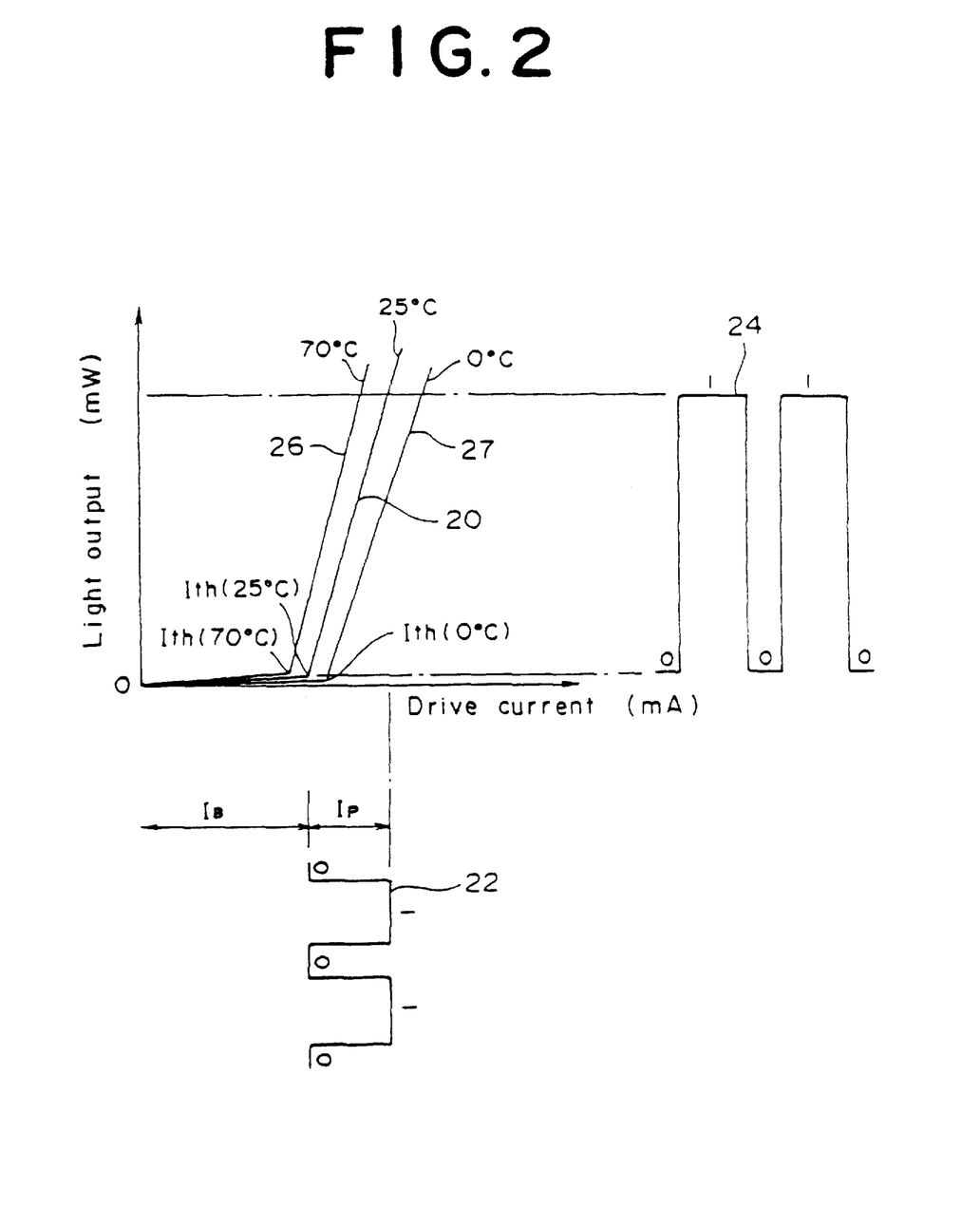
FIG. 2 is a graph showing the operation characteristic of the laser diode module.

FIG. 2 shows an operation characteristic of the laser diode module. In this module, the laser diode 4 is controlled in temperature so that the resistance of a thermistor (to be hereinafter described) provided in the vicinity of the laser diode 4 becomes constant. However, if the temperature outside the module is high, the laser diode is overcooled, whereas if the temperature outside the module is low, the laser diode is overheated. In the characteristic shown in FIG. 2, the vertical axis represents a light output (mW) and the horizontal axis represents a drive current (mA) of the laser diode. Reference numeral 20 denotes the I–L characteristic in the case where the temperature outside the module is 25° C., which is substantially equal to an operation temperature of the laser diode. In this case, a drive current 22 obtained by superimposing a modulation current $I_p$ on a bias current $I_B$ substantially equal to an oscillation threshold $T_{th}$ (25° C.) is supplied to the laser diode, thereby obtaining a light output 24 having a good waveform. Reference numeral 26 denotes the I–L characteristic in the case where the temperature outside the module is 70° C. In this case, the I–L characteristic is shifted leftward as viewed in FIG. 2 because of overcooling of the laser diode. Reference numeral 27 denotes the I–L characteristic in the case where the temperature outside the module is 0° C. in this case, the I–L characteristic is shifted rightward as viewed in FIG. 2 because of overheating of the laser diode.

Such rightward or leftward shifting of the I–L characteristic causes a change in the oscillation threshold by about ±2 mA. As a result, in the case where the bias current value in the drive current 22 is constant, the light output waveform and an extinction ratio are deteriorated. Such a phenomenon is considered to be due to the fact that a quantity of heat flowing through a bonding wire into the laser diode is different from a quantity of heat flowing through a bonding wire into the thermistor to lack a balance between the temperature in the vicinity of the laser diode and the temperature in the vicinity of the thermistor.

Figure 3A:
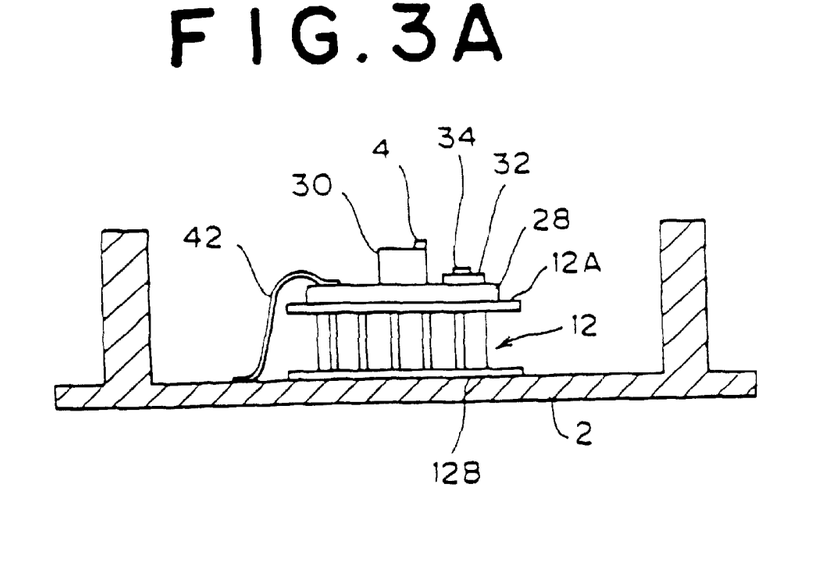
FIGS. 3A and 3B are sectional views of the laser diode module.
Figure 3B:
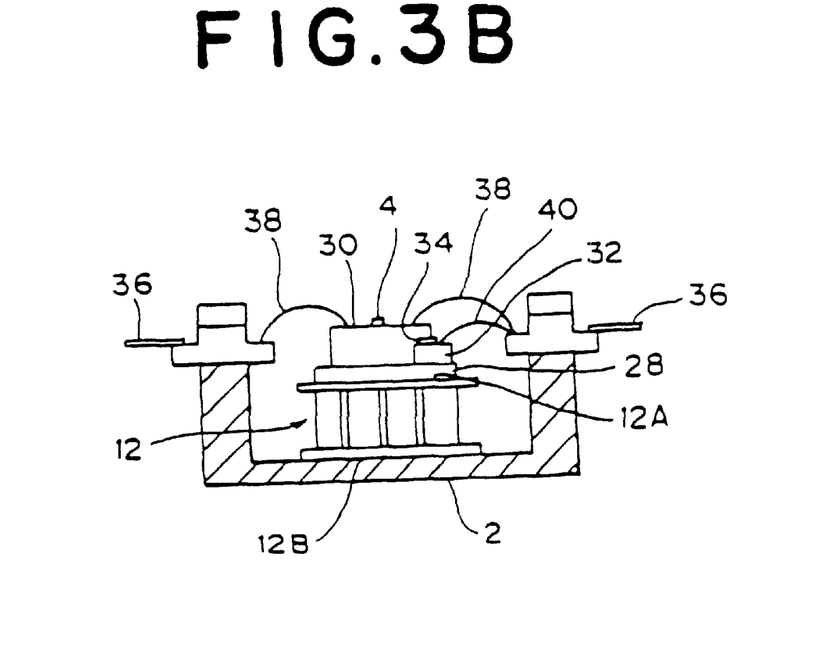

FIGS. 3A and 3B are sectional views of an essential part of the module shown in FIG. 1. The Peltier element 12 is provided so that its lower surface 12B is in close contact with the inner surface of the housing 2, and a base 28 formed of Kovar, for example, is fixed to an upper surface 12A of the Peltier element 12. The Peltier element 12 performs heat exchange between the upper surface 12A and the lower surface 12B according to a drive current supplied, thereby effecting temperature control of the laser diode. A laser carrier 30 and a thermistor carrier 32 both formed of copper, for example, are provided on the base 28 in close contact therewith, and the laser diode 4 and a thermistor 34 are provided on the carriers 30 and 32 in close contact therewith, respectively. Reference numerals 36 denote a plurality of leads for connecting the module to external circuits. The laser diode 4 is connected through bonding wires 38 and conductor patterns (not shown) to the leads 36, and the thermistor 34 is connected through bonding wires 40 and conductor patterns (not shown) to the leads 36.

To correct the lack of the temperature balance mentioned above, this preferred embodiment employs a metal plate 42 for thermally connecting a portion of the base 28 in the vicinity of the laser carrier 30 to the housing 2. The metal plate 42 is formed of stainless steel, for example, and it is connected to the base 28 and the housing 2 by laser welding, for example. In the case where the housing 2 is formed of metal and it is maintained at a ground potential, the base 28 can be grounded by the metal plate 42. The position on the base 28 where the metal plate 42 is connected is preferably set on the opposite side so the thermistor carrier 32 with respect to the laser carrier 30. The position on the housing 2 where the metal plate 42 is connected is preferably set in the vicinity of the Peltier element 12.

Although not shown, a control circuit for controlling a current flowing in the Peltier element 12 so as to make the temperature of the thermistor 34 constant is provided inside or outside the module. The shape (length and sectional area) of the metal plate 42 is set so that the temperature of the thermistor 34 becomes substantially equal to the temperature of the laser diode 4 under the control of the current flowing in the Peltier element 12. More specifically, in order to reduce the shift of the threshold of the laser diode with regard to whether the temperature outside the module is high or low, it is required not to lack the temperature balance between the laser diode section and the thermistor section inside the module. Now, the operation of the metal plate 42 for correcting the lack of the temperature balance will be described.

Figure 4:
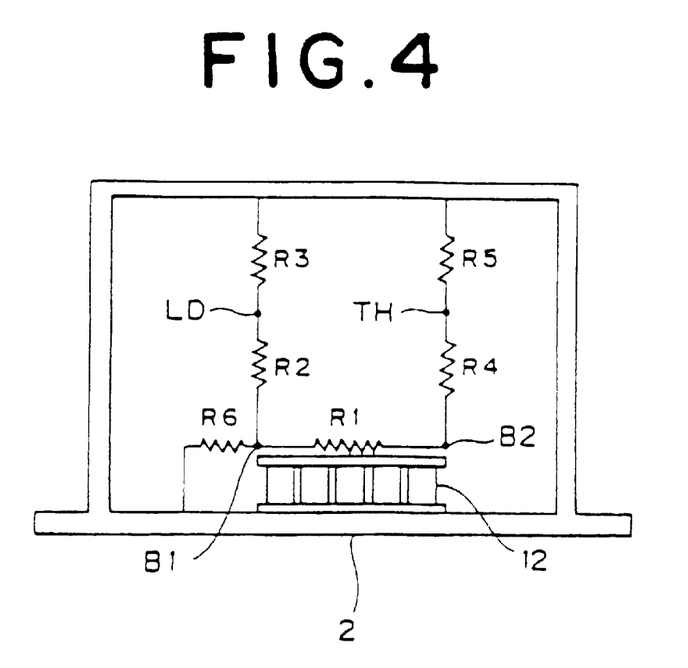
FIG. 4 is a thermal simulation diagram of the laser diode module.

FIG. 4 is a thermal simulation diagram in the laser diode module. In FIG. 4, R1 denotes a thermal resistance of the base 28; R2 denotes a thermal resistance of the laser carrier 30; R3 denotes a thermal resistance of the bending wires 38 connected to the laser diode 4; R4 denotes a thermal resistance of the thermistor carrier 32; R5 denotes a thermal resistance of the bonding wires 40 connected to the thermistor 34; and R6 denotes a thermal resistance of the metal plate 42. LD and TH denote the laser diode 4 and the thermistor 34, respectively. B1 and B2 denote the positions of the laser carrier 30 and the thermistor carrier 32 on the base 28, respectively.

In the case where the threshold of the laser diode has been shifted, and thermal equilibrium is obtained in the condition where there is a difference between the temperature $T_{LD}$ of the laser diode and the temperature $T_{TH}$ of the thermistor, the heat quantity $Q_{LD}$ flowing into the laser diode is given by the following equation.

$$Q_{LD} = \lambda_1 \times S_1 \times N_1 \times (T_A - T_{LD})/L_1 \tag{1}$$

where $\lambda_1$, $S_1$, $N_1$, and $L_1$ denote the unit thermal resistance, the sectional area, the number, and the length, respectively, of the bonding wires connected to the laser diode; and $T_A$ denotes the atmospheric temperature outside the module. On the other hand, the heat quantity $Q_{TH}$ flowing into the thermistor is given by the following equation.

$$Q_{TH} = \lambda_2 \times S_2 \times N_2 \times (T_A - T_{TH})/L_2 \tag{2}$$

where $\lambda_2$, $S_2$, $N_2$, and $L_2$ denote the unit thermal resistance, the sectional area, the number, and the length, respectively, of the bonding wires connected to the thermistor. Since the heat quantity $Q_{LD}$ moves through the laser carrier to the point B1 on the base, the temperature $T_{B1}$ at the point B1 is given by the following equation.

$$Q_{LD} = \lambda_3 \times S_3 \times (T_{LD} - T_{B1})/L_3 \tag{3}$$

Further, since the heat quantity $Q_{TH}$ moves through the thermistor carrier to the point B2 on the base, the temperature $T_{B2}$ at the point B2 is given by the following equation.

$$Q_{TH} = \lambda_4 \times S_4 \times (T_{TH} - T_{B2})/L_4 \tag{4}$$

In Eq. (3), $\lambda_3$, $S_3$, and $L_3$ denote the unit thermal resistance, the sectional area, and the length (thickness), respectively, of the laser carrier; and in Eq. (4), $\lambda_4$, $S_4$, and $L_4$ denote the unit thermal resistance, the sectional area, and the length (thickness), respectively, of the thermistor carrier.

In general, the number of the bonding wires connected to the laser diode is greater than the number of the bonding wires connected to the thermistor, so that $Q_{TH}<Q_{LD}$. However, when the difference in thermal conductivity between the laser carrier and the thermistor carrier is large ($\lambda_4<<\lambda_3$) to cause a temperature difference between the point B1 and the point B2 on the base, and the temperature $T_{TH}$ of the thermistor is monitored to perform temperature control, $T_{LD}<T_{TH}$. To eliminate the temperature difference between the laser diode and the thermistor, the present invention employs the metal plate for correcting the temperature difference between the point B1 and the point B2 on the base to thereby increase heat flowing from the outside of the module.

A specific example of calculation for setting the shape of the metal plate will now be described. In the case where the outside temperature $T_A$ is 25° C., both the temperature $T_{LD}$ of the laser diode and the temperature $T_{TH}$ of the thermistor becomes equal to 25° C. without forcible movement of heat by the Peltier element. However, in the case of $T_A=75°$ C., the Peltier element performs temperature control and the temperature difference (e.g., about 2° C.) between $T_{LD}$ and $T_{TH}$ is caused by the difference in thermal conductivity between the laser carrier and the thermistor carrier and the difference in rate of heat flow between the laser diode and the thermistor. Accordingly, the threshold current of the laser diode becomes different from that in the case of $T_A=25°$ C.

As a specific example of calculation, the values of Q and $Q_{TH}$ in the case of $T_{TH}=25°$ C. and $T_{LD}=23°$ C. will now be obtained. Specific values used in the calculation are $\lambda_1=\lambda_2=300$, $\lambda_3=400$, $\lambda_4=40, S_1=S_2=0.02$ mm$^2$, S3=12 mm$^2$, S4=1.3 mm$^2$, $L_1=L_2=L_3=1.5$ mm, $L_4=0.3$ mm, $N_1=8$, and $N_2=2$. By using these specific values, the values OF $Q_{LD}$ and $Q_{TH}$ are calculated from Eqs. (1) and (2) as follows:

$$Q_{LD}=300\times0.02\times8\times(75-23)/1.5=1664 \quad (5)$$

$$Q_{TH}=300\times0.02\times2\times(75-25)/1.5=416 \quad (6)$$

The value of $Q_{LD}$ obtained in Eq. (5) is inserted into Eq. (3), to obtain the value of $T_{B1}$ equal to 22.48° C. Further, the value of $Q_{TH}$ obtained in Eq. (6) is inserted into Eq. (4) to obtain the value of $T_{B2}$ equal to 23.4° C. As a result, the temperature difference $\Delta T$ between the point B1 and the point B2 is equal to 0.92° C.

Then, in the case where the thermal resistance, the sectional area, and the length of the base are set to 40.5 mm$^2$, and 8 mm, respectively, the heat quantity $Q_B$ flowing between the point B1 and the point B2 is calculated to $Q_B=40\times5\times0.92/8=23$. If the value of $Q_B$ becomes zero, the temperature difference between the laser diode and the thermistor becomes zero. Therefore, the shame of the metal plate is set so that the value of becomes zero. For example, in the case where the material of the metal plate is stainless steel, and the sectional area and the length of the metal plate are 0.05 mm$^2$ and 5 mm, respectively, the heat quantity Q flowing in the metal plate is calculated to Q=40×0.05×(80−22.48)/5=23. As a result, the temperature difference between the point B1 and the point B2 becomes zero.

In this manner, according to this preferred embodiment of the present invention, the shape of the metal plate is suitably set to thereby make the temperature of the laser diode substantially equal to the temperature of the thermistor, thus allowing high-precision temperature control of the laser diode.

In the LD module as shown in FIG. 1, the light radiated from the laser diode 4 is collimated by the first lens assembly 8 to obtain a parallel light beam. The light beam is passed through the optical isolator 14, then condensed again by the second lens 16, and then coupled to the optical fiber 18. Accordingly, the relative positional relationship between the laser diode 4, the first lens assembly 8, the second lens 16, and the optical fiber 18 has a direct influence upon an optical coupling efficiency. The optical isolator 14, the second lens 16, and the optical fiber 18 are parts to be later mounted to the housing 2, so that the optical axis adjustment may be performed at the time of mounting these parts. However, as to the laser diode 4 and the first lens assembly 8 located inside the housing 2, the predetermined relative positional relationship is desirably ensured in assembling the parts in the housing 2.

According to this preferred embodiment of the present invention to satisfy this desired, there is provided an LD module comprising a laser diode, a lens for collimating light radiated from the laser diode, a housing in which the laser diode and the lens are stored, and means for holding the lens in predetermined positional relationship to the laser diode, the holding means comprising a lens holder in which the lens is inserted, the lens holder having a first surface and a second surface parallel to each other, and a base integrally having a first support portion having a reference surface with which the first surface is in close contact and a second support portion to which the second surface is fixed.

Preferably, the lens holder is fixed to the first and second support portions by laser welding.

More preferably, the thickness of the second support portion is enough smaller than the thickness of the first support portion. A specific embodiment of this structure will now be described.

Figure 5:
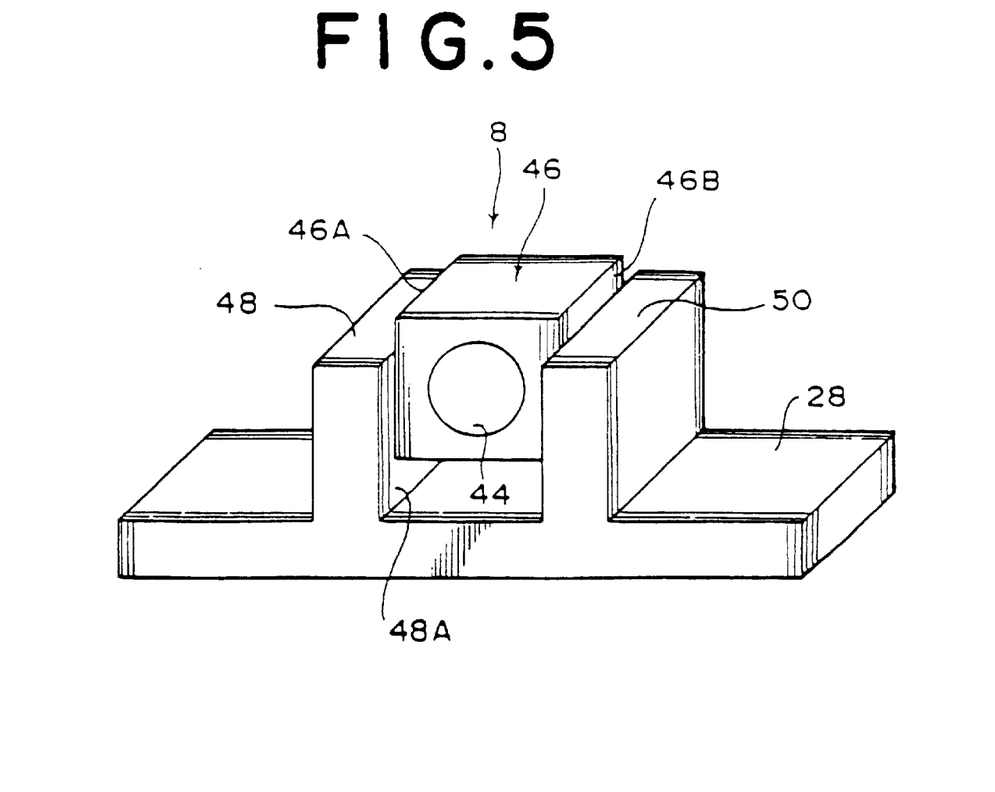
FIG. 5 is a perspective view of a holding structure for a first lens.

FIG. 5 is a perspective view of the holding structure for the first lens (the first lens assembly 8). A first lens 44 is mounted by press fitting, for example, in a lens holder 46 formed of metal. The lens holder 46 has a first surface 46A and a second surface 46B parallel to each other. The upper surface of the base 28 is integrally formed with a first support portion 48 having a substantially rectangular parallelepiped shape and a second support portion 50 having a substantially rectangular parallelepiped shape parallel to each other. The first support portion 48 has a flat reference surface 48A opposed to the second support portion 50.

In fixing the lens holder 46 to the base 28, the lens holder 46 is first adjusted in position by making the first surface 46A of the lens holder 46 come into close contact with the reference surface 48A and sliding the lens holder 46 on the first support portion 48. After ensuring a proper position of the lens holder 46, this position is fixed by laser welding, or example. Thereafter, the second support portion 50 is pressed on the second surface 46B of the lens holder 46 and then fixed by laser welding, thus completing the holding of the first lens 44. According to this structure, the lens holder 46 can be sandwiched between the first support portion 48 and the second support portion 50, thereby precisely setting the first lens 44 at a predetermined position relative to the laser diode 4 and easily obtaining a high optical coupling efficiency.

Figure 6:
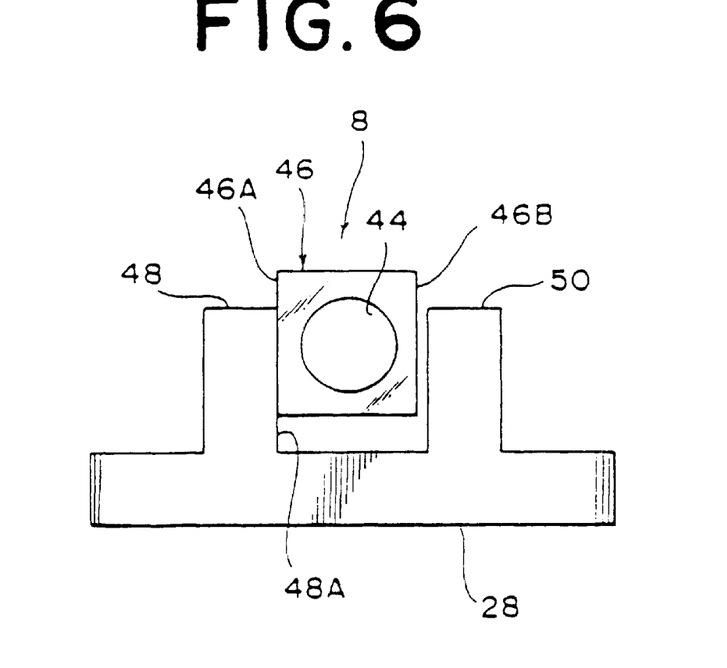
FIG. 6 is an elevational view of the holding structure for the first lens.

FIG. 6 is an elevational view of the holding structure shown in FIG. 5, and shows a condition where the lens holder 46 is fixed to the first support portion 48. The distance between the first surface 46A and the second surface 46B in the lens holder 46 is slightly smaller than the space between the first support portion 48 and the second support portion 50. Accordingly, in the condition where the first surface 46A is in close contact with the reference surface 48A, there is defined a small gap between the second surface 46B and the second support portion 50. The reason why such a cap is defined is to prevent a possibility that the lens holder 46 may not be inserted between the first support portion 48 and the second support portion 50 because of a dimensional error in the manufacture of the lens holder 46 or the base 28.

In the case of fixing the second surface 46B of the lens holder 46 and the second support portion 50 together by laser welding, no gap must be present at a welding portion. Therefore, in the case where the above-mentioned gap is defined between the second surface 46B and the second support portion 50, the second support portion 50 is pressed on the lens holder 46 and fixed thereto by laser welding. As a result, stress is left in the second support portion 50 after completing the laser welding. If the rigidity of the second support portion 50 is high, there is a possibility that the residual stress may cause distortion of the lens holder 46, causing a crack in the first lens 44. Another embodiment improved in this respect will now be described with reference to FIG. 7.

Figure 7:
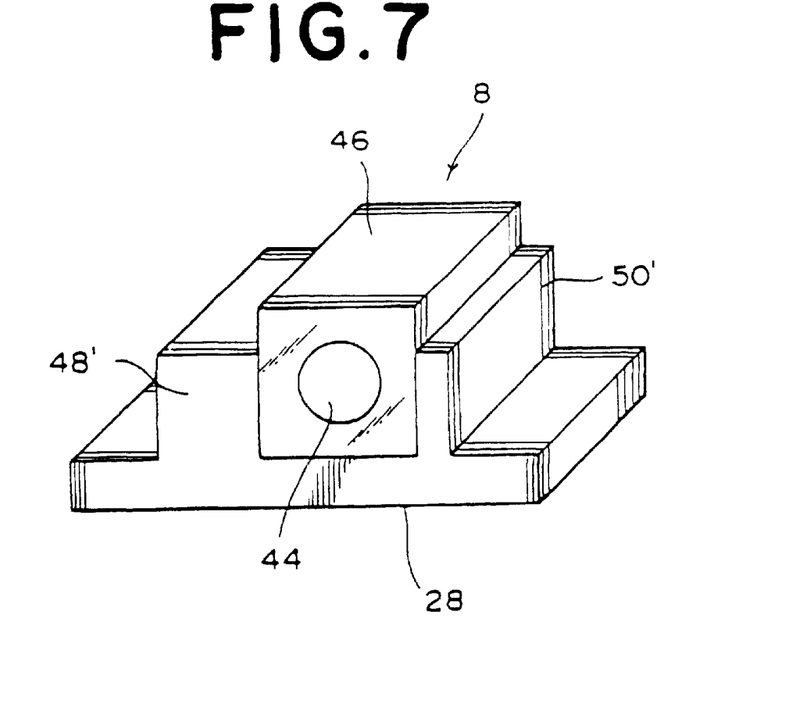
FIG. 7 is a perspective view of an improved holding structure for the first lens.

FIG. 7 is a perspective view of an improved holding structure for the first lens. In this preferred embodiment, the thickness of a second support portion 50' is set enough smaller than the thickness of a first support portion 48'. The reason why the first support portion 48' is made thicker than the second support portion 50' is to improve the accuracy of deciding the position of the lens holder 46. Further, the reason why the second support portion 50' i s made thinner than the first support portion 48' is to prevent damage to the first lens 44 due to the residual stress in the second support portion 50'.

Calculation will be made on the residual stress generated in the second support portion 50' after laser welding. Letting b, 1, h, and E denote the length (along the optical axes), the height, the thickness, and the Young's modulus, respectively, of the second support portion 50', and d denote the gap between the lens holder 46 and the second support portion 50', the residual stress P is given by the following equation.

$$P=bdEh^2/4l^3$$

As an example in this preferred embodiment, the thickness h was changed from 0.3 mm as a conventional value to 0.25 mm, thereby allowing the residual stress P to be reduced from 2.9 kg to 2.0 kg.

Figure 8A:
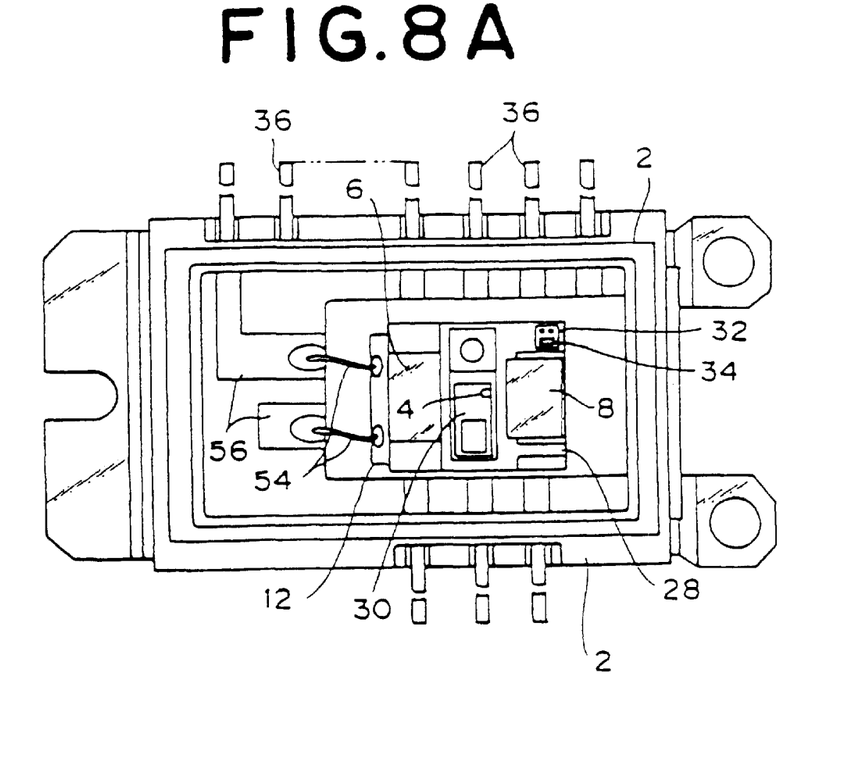
FIGS. 8A and 8B are a top plan view and a sectional view of the laser diode module, respectively.
Figure 8B:
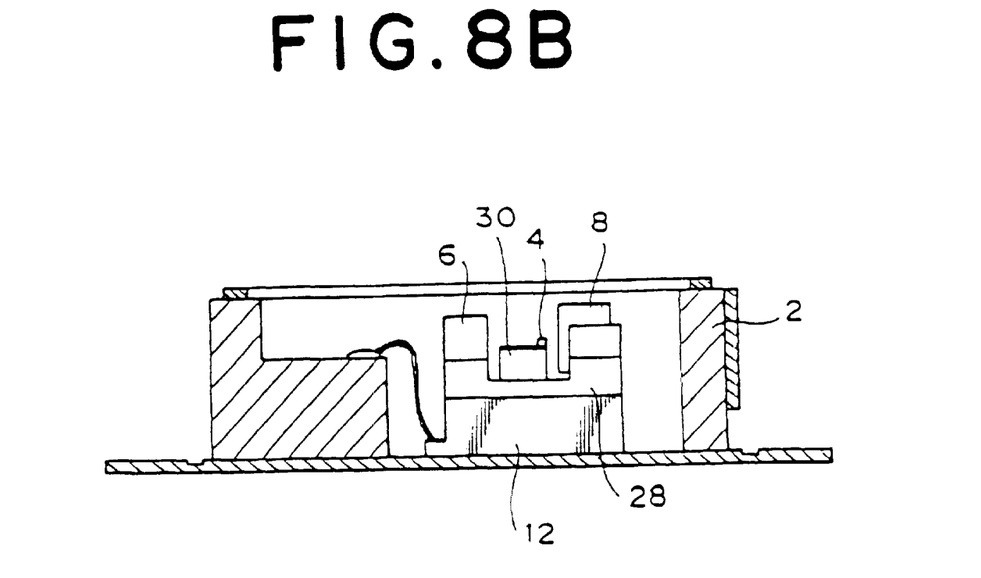

FIGS. 8A and 8B are a top plan view and a sectional view of the LD module, respectively. The leads 36 serve to connect the Peltier element 12, the laser diode 4, the thermistor 34, and the photodiode 6 to the external circuits. The Peltier element 12 is connected through lead wires 54 and conductor patterns 56 to the leads 36. The laser diode 4, the thermistor 34, and the photodiode 6 are connected through bonding wires (not shown) to the leads 36.

Figure 9:
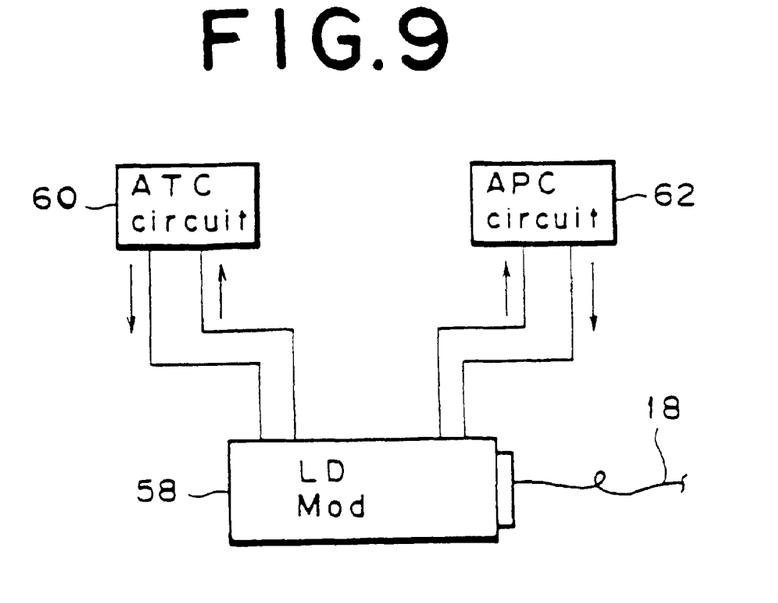
FIG. 9 is a connection diagram of the laser diode module.

FIG. 9 is a connection diagram of the LD module. An LD module 58 is connected to an ATC circuit 60 and an APC circuit 62 by using the leads 36 (see FIGS. 8A and 8B). The ATC circuit 60 controls a current flowing in the Peltier element 12 according to a signal supplied from the thermistor 34 so that the temperature of the thermistor 34 becomes constant. The APC circuit 62 controls a bias current in the laser diode 4 in receipt of a signal from the photodiode 6 so that a photocurrent in the photodiode 6 becomes constant. In the case where the ATC circuit 60 is used, the shape of the metal plate 42 mentioned with reference to FIGS. 3A and 4 is set so that the temperature of the thermistor 34 becomes substantially the same as the temperature of the laser diode 4. Accordingly, variations in threshold current of the laser diode can be suppressed.

In the case where the ATC circuit 60 and the APC circuit 62 are located in the vicinity of the LD module 58, there is a possibility that the housing of the LD module 58 may be heated because of relatively large power consumptions of the ATC circuit 60 and the APC circuit 62, requiring a Peltier element having a large capacity and a large size, which causes a difficulty of size reduction of the module.

In this respect, the next preferred embodiment of the present invention employs the drive current of the Peltier element also serving as the bias current of the laser diode. That is, according to this preferred embodiment, there is provided an LD module comprising a laser diode, means for supplying to the laser diode a drive current obtained by superimposing a modulation current on a bias current, a thermoelectric cooling element (Peltier element) for cooling the laser diode according to a control current supplied, and means for extracting the bias current from the drive current and supplying the bias current extracted as the control current to the thermoelectric cooling element. This preferred embodiment will now be described more specifically.

Figure 10:
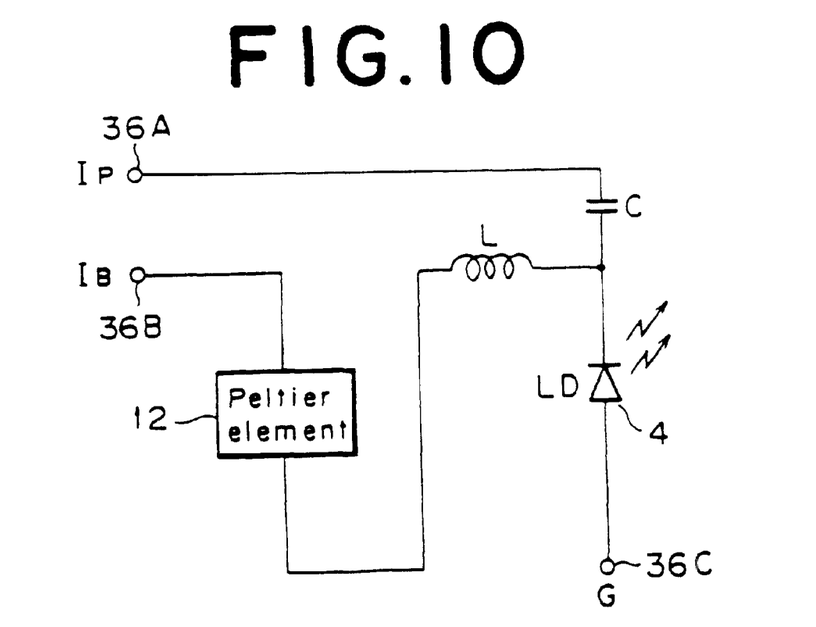
FIG. 10 is a wiring diagram in the laser diode module.

FIG. 10 is a wiring diagram in the LD module. Reference numeral 36A denotes a lead supplied with a pulsed modulation current $I_s$; reference numeral 36B denotes a lead supplied with a DC bias current $I_B$; and reference numeral 36C denotes a lead maintained at a ground potential. The lead 36A is connected through a capacitor C to the cathode of the laser diode 4, and the lead 36B is connected through a Peltier element 12 and an inductor L to the cathode of the laser diode 4. The anode of the laser diode 4 is connected to the lead 36C. The inductor L serves to extract he bias current from the drive current of the laser diode 4, and the capacitor C serves to cut off the DC bias current from a modulation circuit.

In this preferred embodiment, when the temperature of the laser diode is relatively low, the threshold current of the laser diode 4 is low, that is, the bias current is small. Accordingly, the Peltier element 12 is almost inoperative. On the other hand, when the temperature of the laser diode becomes relatively high, the threshold current of the laser diode 4 becomes high to result in an increase in the bias current. Accordingly, a large quantity of current flows in the Peltier element 12 to enhance the cooling operation.

Figure 11:
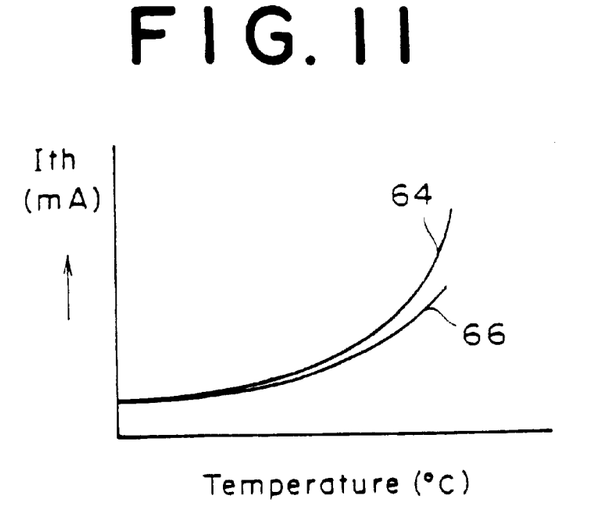
FIG. 11 is a graph showing the characteristic of the module shown in FIG. 10.

FIG. 11 is a graph showing the characteristic of the LD module shown in FIG. 10. In FIG. 11, the vertical axis represents the threshold current $I_{th}$, and the horizontal axis represents the temperature of the laser diode. Reference numeral 64 denotes the characteristic in the case where temperature control is not performed, and reference numeral 66 denotes the characteristic in this preferred embodiment. As apparent from the graph shown, the threshold current at a relatively high temperature can be suppressed in this preferred embodiment. Further, in this preferred embodiment, the bias current flows in the Peltier element 12, thus eliminating the need for the thermistor and the ATC circuit.

Figure 12:
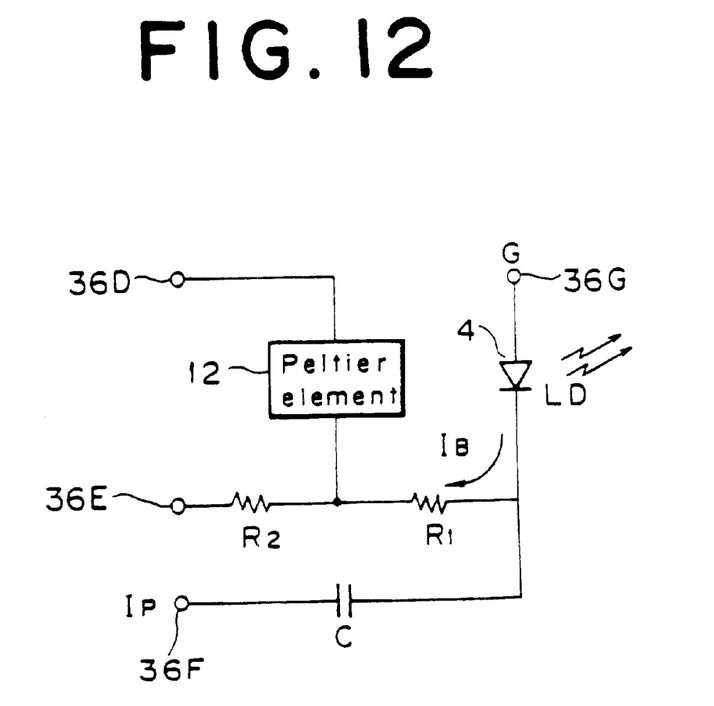
FIG. 12 is another wiring diagram in the laser diode module.

FIG. 12 is another wiring diagram in the LD module. The pulsed modulation current $I_p$ of the drive current flowing in the laser diode 4 whose anode is connected to a lead 36G kept at a ground potential is allowed to flow through the capacitor C and a lead 36F connected to the cathode of the laser diode 4. The DC bias current $I_B$ of the drive current of the laser diode 4 flows through a resistor $R_1$ connected to the cathode of the laser diode 4, and is then divided into two components. One of the two components flows through a Peltier element 12 and a lead 36D, and the other flows through a resistor $R_2$ and a lead 36E.

In this configuration shown in FIG. 12, when the ratio in resistance between the resistor $R_1$ and the resistor R2 is set to 1:30, for example, and the bias current of the laser diode 4 is set to 10 mA, a current of about 300 mA flows through the Peltier element 12. Accordingly, the effect in the previous preferred embodiment (suppression of the threshold current) can be made more remarkable.

Figure 13:
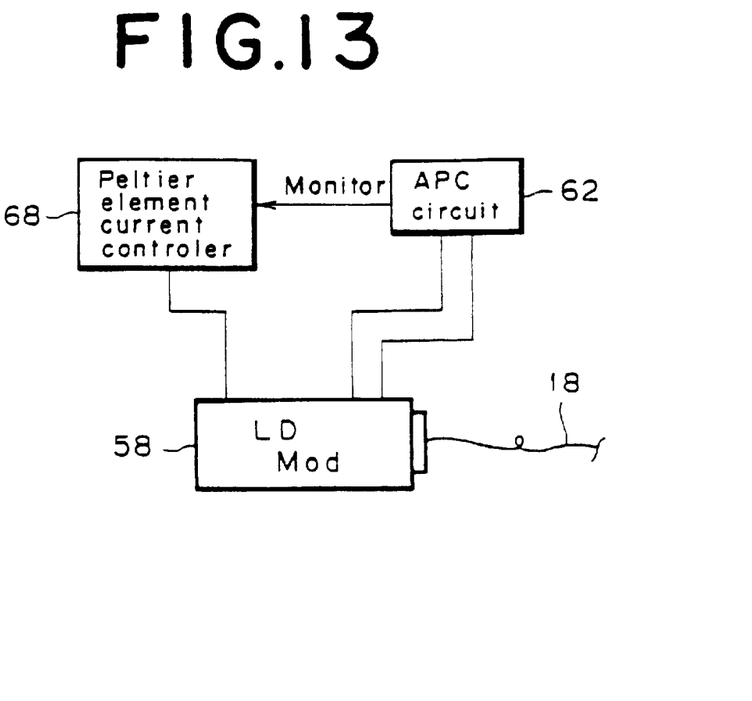
FIG. 13 is another connection diagram of the laser diode module.

FIG. 13 is another connection diagram of the LD module. In contrast to the preferred embodiment shown in FIG. 9, this preferred embodiment is characterized in that a Peltier element current controller 68 Is provided in place of the ATC circuit 60. The Peltier element current controller 68 detects the bias current of the laser diode and controls the control current of the Peltier element 12 so that the bias current detected becomes constant. More specifically, the bias current of the laser diode 4 is detected by the APC circuit 62, and a monitor signal from the APC circuit 62 is supplied to the Pettier element current controller 68, thereby performing the above control.

The bias current of the laser diode changes with a temperature change. Accordingly, the temperature of the laser diode is maintained at a constant value by controlling the current in the Peltier element so as to make the bias current constant. In this preferred embodiment, the thermistor for detecting the temperature in the vicinity of the laser diode is unnecessary, thereby eliminating the threshold variations due to a temperature difference between the thermistor and the laser diode. Accordingly, the configuration of the LD module can be made simple.

Figure 14:
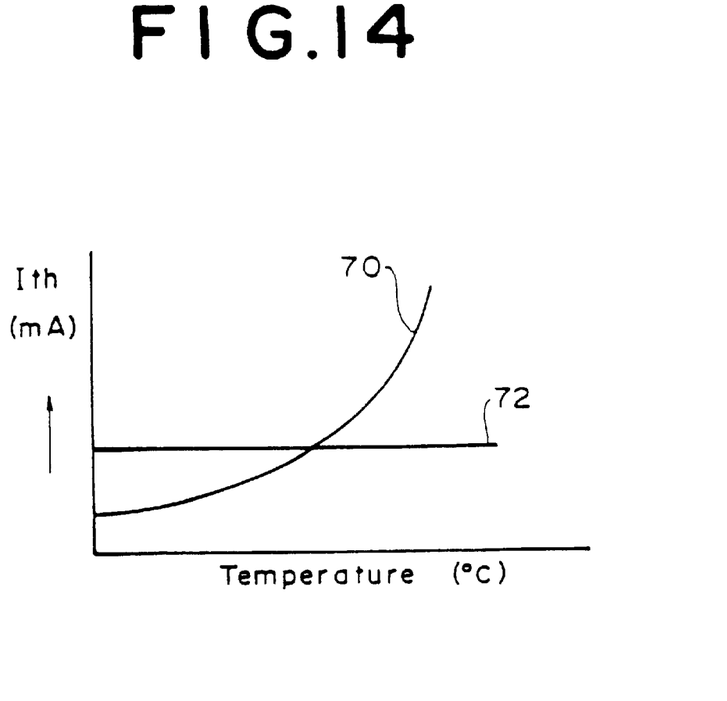
FIG. 14 is a graph showing the characteristic of he module shown in FIG. 13.

FIG. 14 is a graph showing the characteristic of the LD module shown in FIG. 13. In FIG. 14, the vertical axis represents the threshold current $I^{th}$, and the horizontal axis represents the temperature of the laser diode. Reference numeral 70 denotes the characteristic in the case where temperature control is not performed, and reference numeral 72 denotes the characteristic in this preferred embodiment wherein temperature control is performed so as to make the bias current constant. As apparent from the graph shown, the threshold current can be maintained at a constant value irrespective of temperature.

According to the present invention as described above, high-precision temperature control of the LD in the laser diode module can be performed.

What is claimed is:

1. A laser diode module comprising:

a laser diode for outputting a light beam; a lens for converting a beam parameter of said light beam on an optical path;

a housing in which said laser diode and said lens are stored; and holding means provided in said housing for holding said lens in predetermined positional relationship to said laser diode;

said holding means comprising a lens holder in which said lens is inserted, said lens holder having a first surface and a second surface parallel to each other, and a base integrally having a first support portion having a reference surface with which said first surface is in close contact and a second support portion to which said second surface is fixed, said reference surface being substantially parallel to said optical path.

2. A laser diode module according to claim 1, wherein said lens holder is fixed to said first and second support portions by laser welding.

3. A laser diode module according to claim 1, wherein a thickness of said second support portion is smaller than a thickness of said first support portion.

* * * * *